United States Patent [19]

Sakai et al.

[11] Patent Number: 5,091,212
[45] Date of Patent: Feb. 25, 1992

[54] METHOD AND APPARATUS FOR FORMING ELECTRODE ON ELECTRONIC COMPONENT

[75] Inventors: Norio Sakai; Kenji Minowa; Shinji Morihiro, all of Kyoto, Japan

[73] Assignee: Murata Manufacturing Co., Ltd., Japan

[21] Appl. No.: 452,755

[22] Filed: Dec. 19, 1989

[30] Foreign Application Priority Data

Dec. 19, 1988 [JP] Japan .................. 63-321629

[51] Int. Cl.$^5$ ............................. C23C 26/00
[52] U.S. Cl. ............................. 427/96; 118/50
[58] Field of Search ..................... 427/96; 118/50

[56] References Cited

U.S. PATENT DOCUMENTS

| 3,576,669 | 4/1971 | Filip | 427/97 |
| 3,690,943 | 9/1972 | Papiano | 427/96 |
| 4,558,388 | 12/1985 | Graves | 118/50 |
| 4,655,162 | 4/1987 | Kameyama | 118/50 |
| 4,749,421 | 6/1988 | Matsui et al. | |
| 4,767,643 | 8/1988 | Westervelt | 118/50 |

FOREIGN PATENT DOCUMENTS

WO85/00590 2/1985 PCT Int'l Appl. .
622201 10/1945 United Kingdom .
2185437A 7/1987 United Kingdom .

Primary Examiner—Shrive Beck
Assistant Examiner—Vi Duong Dang
Attorney, Agent, or Firm—Ostrolenk, Faber, Gerb & Soffen

[57] ABSTRACT

Disclosed herein is a method of forming strip-shaped electrodes over an end surface of a plate-shaped electronic component and two major surfaces which are in series with the end surface. A slit plate, which is provided with through slits having width corresponding to the width of electrodes to be formed, is located above an electrode paste bath while an electronic component is arranged above the slit plate so that its end surface extends across the through slits. Before or after this step, the electrodes paste is made to swell to a constant level beyond the upper surface of the slit plate, thereby applying the electrode paste to the end surface of the electronic component and the two major surfaces which are in series with the end surface in the form of strips.

9 Claims, 7 Drawing Sheets

METHOD AND APPARATUS FOR FORMING ELECTRODE ON ELECTRONIC COMPONENT

BACKGROUND OF THE INVENTION

1. Field of the Invention

The present invention relates to a method and an apparatus for forming an electrode on a part of an end surface, for example, of an electronic component with electrode paste, and more particularly, it relates to a method and an apparatus for applying electrode paste to a portion of an electronic component to be provided with an electrode.

2. Description of the Background Art

Referring to FIG. 9, electrodes 2 are formed on prescribed outer surface regions of an electronic component 1. Each electrode 2 serially extends over an end surface 1a of the electronic component 1 and respective ones of an opposite pair of major surfaces 1b and 1c, which are in series with the end surface 1a through opposite edges of the end surface 1a. Thus, the electrode 2 has a U-shaped section as a whole, and comprises an electrode part 2a which is positioned on the end surface 1a and electrode parts 2b and 2c which are positioned on the major surfaces 1b and 1c respectively.

In general, such electrodes 2 are typically formed by one of the following two methods employing screen printing:

FIG. 10 shows the first method, in which electronic components 1 are received in cavities 11, which are provided in a holder 10, so that upper end surfaces 1a thereof upwardly project from the cavities 11. Screen printing is performed from above the projecting upper end surfaces 1a to form electrode parts 2a. Then, another holder 12 having cavities 13 is prepared as shown in FIG. 11, to receive the electronic components 1 in the cavities 13 in a sidelong manner as shown in FIG. 12. In this state, screen printing is performed on first major surfaces 1b of the electronic components 1, which are in series with the end surfaces 1a, to form electrode parts 2b. Then, the electronic components 1 are so turned over in the cavities 13 as to upwardly direct second major surfaces 1c, and screen printing is performed to form electrode parts 2c.

FIG. 13 shows the second method, in which electronic components 1 are upwardly arranged between a pair of clamp members 15. Similarly to the first method, screen printing is performed on end surfaces 1a of the electronic components 1 to form electrode parts 2a. Then the aforementioned holder 12 is employed to separately perform screen printing on major surfaces 1b and 1c of the electronic components 1, thereby forming electrode parts 2b and 2c respectively.

In the first and second methods, the electrode parts 2a are formed by screen printing in different manners, while the electrode parts 2b and 2c are formed in the same step.

According to the first method, however, as shown in FIG. 14, parts of electrode paste 2d may be adhered to upper edge portions of a pair of walls defining each cavity 11 during screen printing of each electrode part 2a. Such electrode paste 2d may enter the cavity 11 through a clearance defined around the electronic component 1 which is received therein, to stain the electronic component 1. Further, a screen employed for screen printing is pressed by irregular surfaces of the electronic components 1 projecting from the upper openings of the cavities 11 as shown in FIG. 10, and hence the screen is expanded or damaged.

In the second method, on the other hand, electrode paste may cause a capillary phenomenon to enter clearances between the electronic components 1, which are arranged in close contact with each other so that the end surfaces 1a thereof are subjected to screen printing. Thus, the electronic components 1 may be stained by the electrode paste. In order to prevent this, it is necessary to interpose spacers 14 of paper or the like between the electronic components 1, as shown in FIG. 15. However, it takes time to interpose the spacers 14 between the electronic components 1. Also in the second method, the screen for printing is expanded or damaged similarly to the first method.

In addition, the first and second methods commonly have the following disadvantages:

If an end surface 1a of an electronic component 1 to be screen-printed is rounded as shown in FIG. 16, printed electrode paste 2e is irregularized in thickness over the center and end portions along the direction of thickness of the electronic component 1.

Further, the electrode parts 2a, 2b and 2c of the electrodes 2 must be formed in different steps respectively. In order to carry out these steps, it is necessary to transfer the electronic components 1 from the holder 10 or the clamp member 15 to the holder 12 and to turn over the same within the holder 12, while drying steps are required after the steps of printing the electrode parts 2a, 2b and 2c respectively. Thus, the operation for printing the electrodes 2 is extremely inefficient.

Each electrode 2 is formed by separately printing the three electrode parts 2a, 2b and 2c, and hence the electrode part 2a may deviate from the electrode part 2b and/or the electrode part 2c (not shown), as shown in FIG. 17. Such deviation will be further promoted if the screen is expanded or damaged as hereinabove described, for example. The screen may be also expanded or damaged when the same is used over a long period of time.

The electrode paste is exposed to the outside air during the screen printing steps. Thus, viscosity of the paste may be undesirably changed by evaporation of a solvent contained therein. Such change in viscosity of the paste results in change in thickness of a printed paste film. Thus, the printed paste film may be changed in thickness with time during screen printing.

SUMMARY OF THE INVENTION

Accordingly, an object of the present invention is to provide a method and an apparatus for forming an electrode on an electronic component, which can solve the aforementioned problems caused by screen printing.

In the inventive method of forming electrodes on an electronic component, first prepared are a slit plate which is provided with a through slit having width corresponding to the width of an electrode to be formed, and a bath of electrode paste for forming an electrode. The slit plate is located above the electrode paste bath. An electronic component is arranged above the slit plate so that a surface of the electronic component to be provided with an electrode extends across the through slit. Before or after this step, the electrode paste bath is brought to a level reaching the surface to be provided with an electrode through the through slit. Thus, the electrode paste passes through the through slit and is applied to the surface to be provided with an electrode.

In the step of bringing the electrode paste bath to a level reaching the surface to be provided with an electrode, the electrode paste may be made to partially upwardly swell beyond the upper surface of the slit plate, so that an electrode can be simultaneously formed to extend over an end surface of the electronic component as well as opposite major surfaces which are in series with the end surface.

The inventive method is preferably carried out with an apparatus having the following structure: This apparatus comprises a container having an opening upper surface for storing electrode paste for forming an electrode. The aforementioned slit plate is arranged to close the upper surface of the container. This apparatus further comprises means for providing pressure condition causing such pressure difference that the pressure within the container is higher than that in the exterior of the container, thereby raising up the electrode paste in the through slit.

According to the present invention, the electrode paste is brought to a level reaching the surface to be provided with an electrode through the through slit, to be adhered to the electronic component. Thus, it is possible to simultaneously form an electrode on the end surface of the electronic component and the two major surfaces which are in series with the end surface by making the electrode paste swell beyond the upper surface of the slit plate, if necessary. Further, it is also possible to form an electrode substantially in uniform thickness even if the end surface of the electronic component is rounded.

According to the present invention, the problems caused by expansion or damage of the screen for screen printing can be solved since no screen printing is employed. Thus, the electrode can be formed in high dimensional accuracy. For example, it is possible to form electrodes which are narrower than those formed by screen printing, by reducing the width of the through slit and increasing viscosity of the electrode paste.

It is possible to substantially seal the electrode paste by storing the electrode paste in a container and arranging the slit plate to close an opening of the container. Thus, the electrode paste can be prevented from time change of viscosity since a solvent etc. contained therein hardly evaporates. Consequently, it is possible to reduce time change in thickness of the electrode paste.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
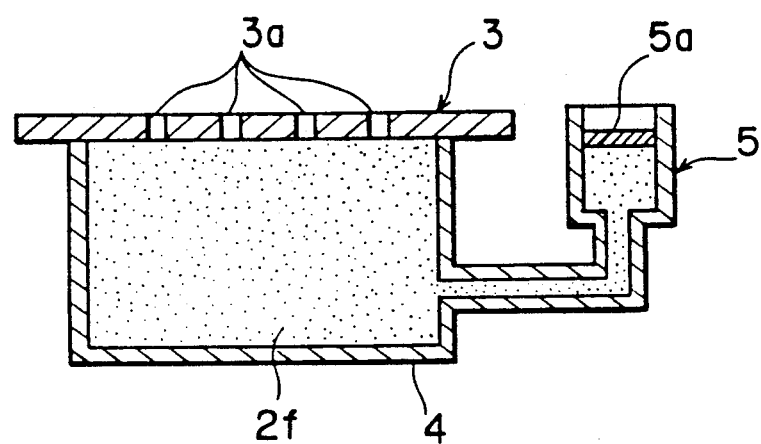
FIG. 1 is a longitudinal sectional view showing an electrode forming apparatus according to an embodiment of the present invention.

FIG. 1 shows an electrode forming apparatus according to an embodiment of the present invention.

This apparatus comprises a slit plate 3 having through slits 3a which are provided in prescribed width at regular intervals in correspondence to the number and positions of electrodes to be formed on electronic components, a container 4 storing electrode paste 2f so that the slit plate 3 is placed thereon, and pressure means 5 provided on the lateral side of the container 4. A presser plate 5a, which is provided on the pressure means 5, is pushed down to press the electrode paste 2f, thereby extruding parts of the electrode paste 2f through the through slits 3a. The junction between the slit plate 3 and the container 4 is so sealed as to prevent leakage of the electrode paste 2f.

Figure 2:
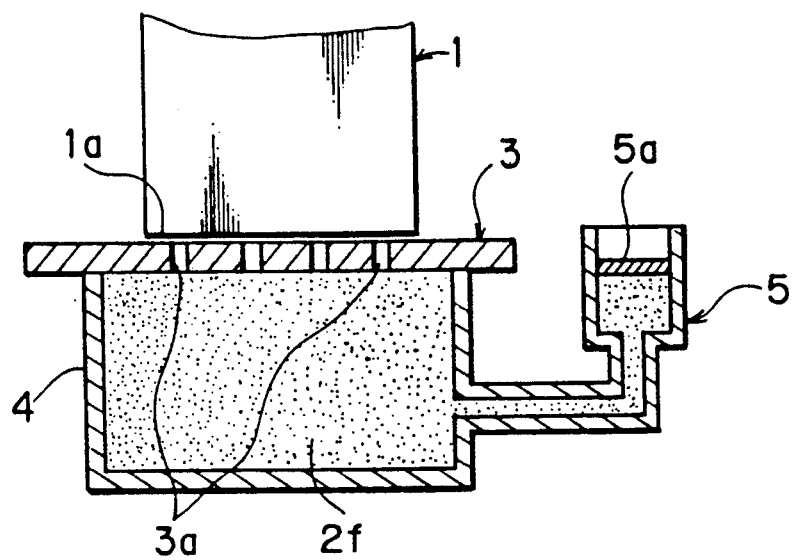
FIGS. 2, 3 and 4 show steps carried out for forming electrodes through the electrode forming apparatus shown in FIG. 1.

When a prescribed preparation step of bringing the electrode paste 2f to a prescribed temperature or the like is completed, an electronic component 1 is upwardly held by a holding member (not shown) or the like and placed on the slit plate 3 so that an end surface 1a of the electronic component 1 to be provided with electrodes extends across the through slits 3a, as shown in FIG. 2. The slit plate 3 and the electronic component 1 may define a clearance therebetween, or may be in contact with each other.

Figure 3:
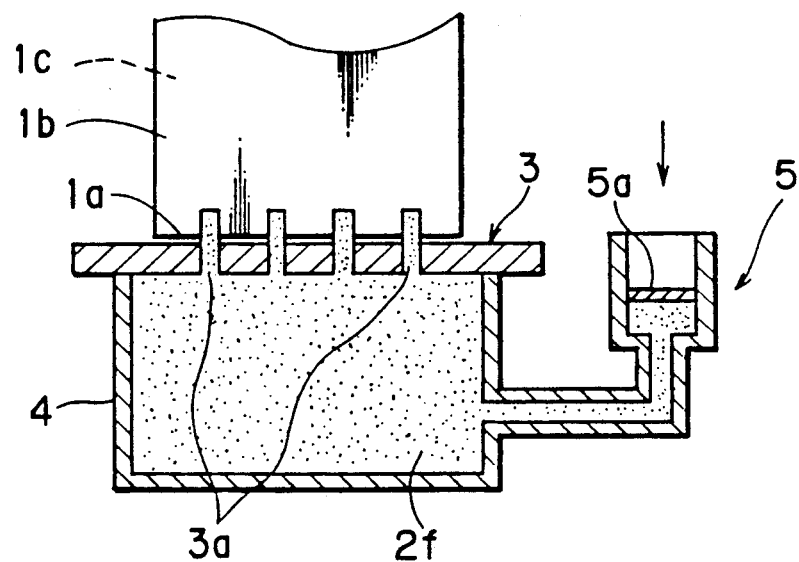

Then the pressure means 5 is driven to extrude a desired volume of the electrode paste 2f from the through slits 3a provided in the slit plate 3, as shown in FIG. 3. Thus, parts of the electrode paste 2f swell from the slit plate 3, to be adhered to the end surface 1a of the electronic component 1 and two major surfaces 1b and 1c which are in series with the end surface 1a.

Figure 4:
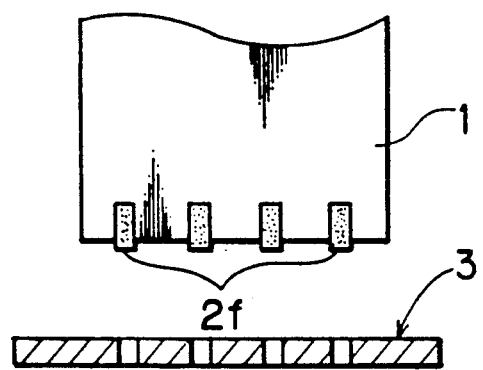
Figure 5:
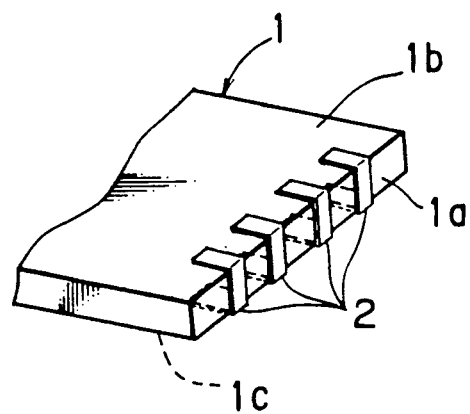
FIG. 5 is a perspective view showing a part of an electronic component 1 which is provided with electrodes through the steps shown in FIGS. 2, 3 and 4.

Thereafter parts of the electrode paste 2f left on the slit plate 3 are returned to the container 4, and the electronic component 1 is lifted up as shown in FIG. 4. Thus, strip-shaped electrodes 2 having U-shaped sections are simultaneously formed on the electronic component 1 in a single electrode forming process over the end surface 1a and the major surfaces 1b and 1c, as shown in FIG. 5. The electronic component 1 may be lifted up before the parts of the electrode paste 2f are returned to the container 4.

Figure 6:
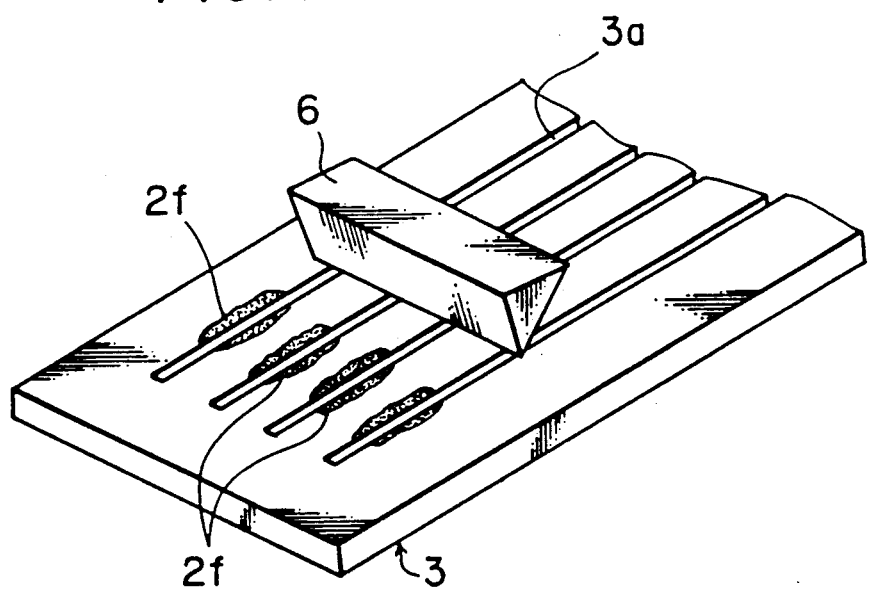
FIG. 6 is a perspective view showing a step of scraping off parts of electrode paste remaining on the upper surface of a slit plate.

Then, parts of the electrode paste 2f adhered to the upper surface of the slit plate 3 are scraped off with a scraper 6 which is in the form of a triangle pole, for example, as shown in FIG. 6. This step is not necessary if no electrode paste 2f is adhered to the upper surface of the slit plate 3. It is noted that parts of the electrode paste 2f remaining in the through slits 3a will not stain the electronic component 1.

Thereafter the above electrode forming process is performed on a next electronic component.

Although the electronic component 1 is first placed on the slit plate 3 and the electrode paste 2f is thereafter extruded on the slit plate 3 in this embodiment, it is also possible to first upwardly extrude the electrode paste 2f to a constant level from the slit plate 3 and thereafter place the electronic component 1 on the slit plate 3, thereby forming the electrodes 2.

Figure 7:
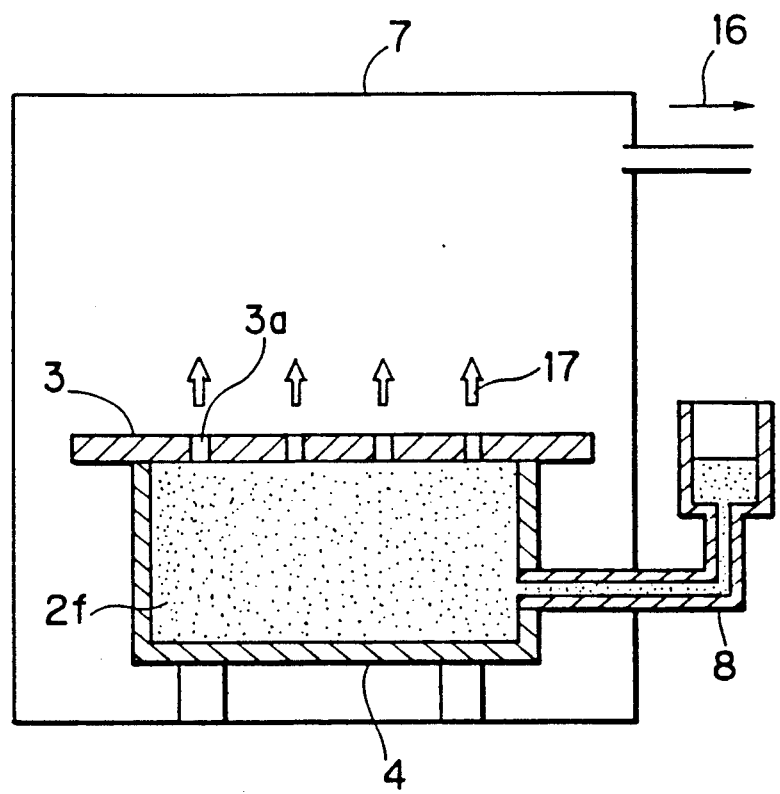
FIG. 7 is a longitudinal sectional view showing an electrode forming apparatus according to another embodiment of the present invention.

While the pressure means 5 is provided on the lateral side of the container 4 to upwardly extrude the electrode paste 2f from the slit plate 3 in the above embodiment, the present invention is not restricted to this. For example, the container 4 may be introduced into a vacuum chamber 7 as shown in FIG. 7 to couple the side surface of the container 4 with a pipe 8 which has an end provided on the exterior of the chamber 7 and decompress the interior of the chamber 7 through vacuum suction by a vacuum pump (not shown) or the like as shown by an arrow 16, thereby sucking up the electrode paste 2f through the slit plate 3 as shown by arrows 17.

Figure 8:
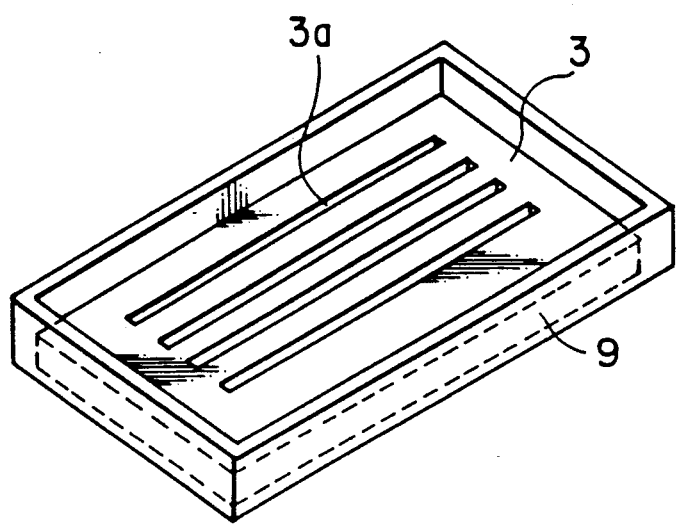
FIG. 8 is a sectional view showing the structure of a slit plate employed in still another embodiment of the present invention.
Figure 9:
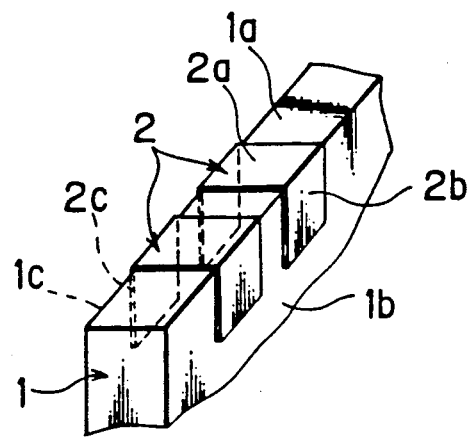
FIG. 9 is a perspective view showing a part of an electronic component which is formed with electrodes by a conventional method.
Figure 10:
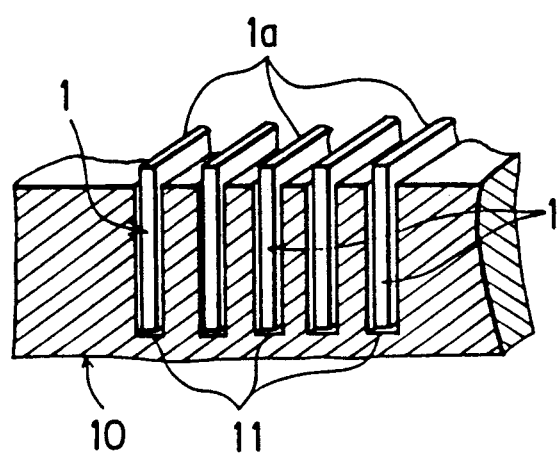
FIG. 10 is a perspective view showing a holder employed in a first conventional method of forming electrodes and electronic components held by the holder.
Figure 11:
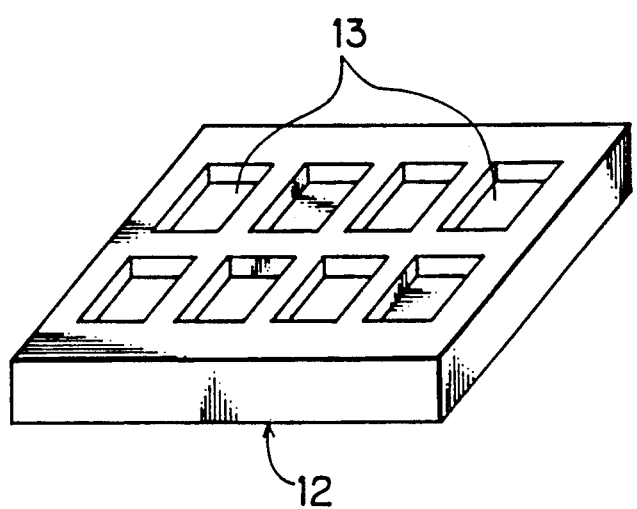
FIG. 11 is a perspective view showing another holder employed in a step carried out after the step shown in FIG. 10.
Figure 12:
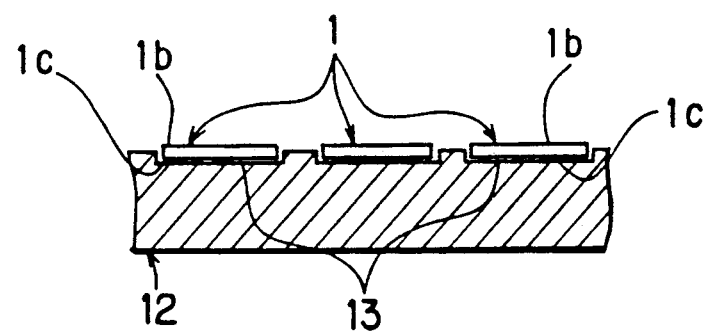
FIG. 12 is a sectional view of the holder shown in FIG. 11, with electronic components being received in cavities.
Figure 13:
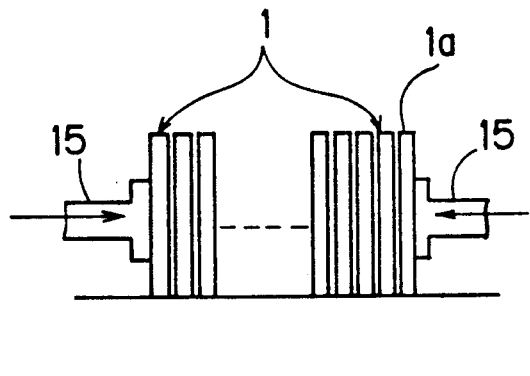
FIG. 13 is a front elevational view showing a step carried out in a second conventional method of forming electrodes.
Figure 14:
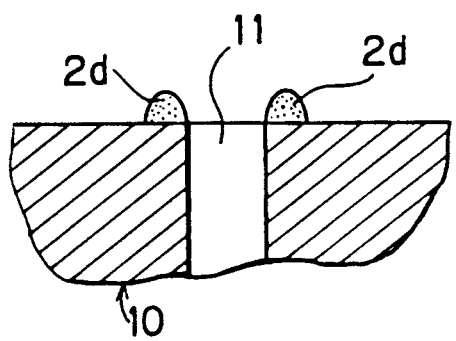
FIG. 14 is an enlarged sectional view showing a part of the holder shown in FIG. 10, for illustrating a problem caused in the first conventional method.
Figure 15:
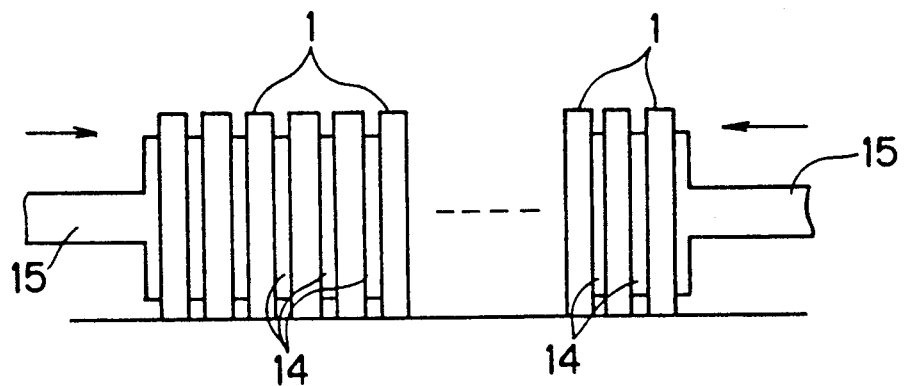
FIG. 15 is a front elevational view for illustrating a method which is employable for solving a problem caused in the second conventional method.

Alternatively, it is also possible to mount side plates 9 around the slit plate 3 to provide upper ends which extend beyond the upper surface of the slit plate 3 as shown in FIG. 8, and submerge the slit plate 3 in an electrode paste bath within such a range that the level of the electrode paste bath is not higher than the upper ends of the side plates 9. Then the electrode paste is made to swell to a constant level from the through slits 3a, thereby forming electrodes on an electronic component.

Although the electronic component 1 is directly placed on the slit plate 3 in the aforementioned embodiment, the present invention is not restricted to this. For example, an elastic sheet may be adhered to the upper surface of the slit plate 3, to improve contact of the slit plate 3 with the electronic component 1. Thus, it is possible to suppress spreading of the electrode paste which is adhered to the electronic component during application, thereby preventing the slit plate 3 from staining.

According to the present invention, a large number of electronic components 1 may be arranged on the slit plate to form electrodes, in order to enable multiple processing.

In the aforementioned embodiment, the electronic component 1 has a flat end surface 1a and an opposite pair of major surfaces 1b and 1c which are in series with the end surface 1a through opposite edges of the end surface 1a, while the electrodes 2 are formed to extend over the first and second edges of the end surface 1a toward parts of the major surfaces 1b and 1c, as shown in FIG. 5. However, the present invention is also applicable to the case of forming electrodes only on the end surface 1a, as well as the case of forming electrodes on the end surface 1a and one of the major surfaces 1b and 1c.

Figure 16:
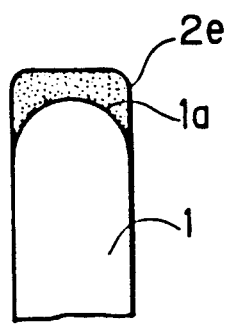
FIG. 16 is an enlarged sectional view showing a part of an electronic component for illustrating a problem commonly caused in the first and second conventional methods.
Figure 17:
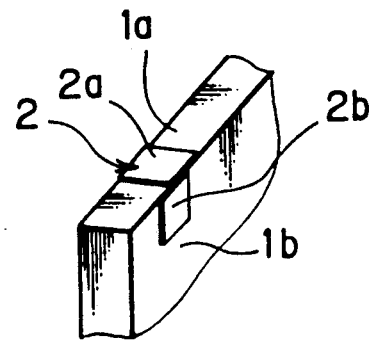
FIG. 17 is a perspective view showing a part of an electronic component for illustrating another problem commonly caused in the first and second conventional methods.

Further, the present invention can also be applied to the case of forming electrodes on the rounded end surface 1a of the electronic component 1 as shown in FIG. 16, for example.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of forming an electrode on a selected portion of at least one surface of an electronic component, comprising the steps of:

preparing a slit plate provided with a through slit having width corresponding to the width of the electrode to be formed;

preparing a bath of electrode paste for forming the electrode;

locating said slit plate above said electrode paste bath;

arranging said electronic component in close proximity above said slit plate so that said portion of said surface to be provided with an electrode extends across said through slit; and bringing said electrode paste bath to such a level that said electrode paste passes through said through slit to reach substantially only said selected portion of said surface to be provided with an electrode;

thereby applying said electrode paste passing through said through slit substantially only to said selected portion of said surface to be provided with an electrode.

2. A method in accordance with claim 1, wherein said step of preparing said electrode paste bath includes a step of storing said electrode paste in a container having an opening upper surface, and said step of locating said slit plate above said electrode paste bath includes a step of arranging said slit plate to close said upper surface of said container.

3. A method in accordance with claim 2, wherein said step of bringing said electrode paste bath to a level reaching said surface to be provided with an electrode includes a step of pressurizing the interior of said container.

4. A method in accordance with claim 2, wherein said step of bringing said electrode paste bath to a level reaching said surface to be provided with an electrode includes a step of decompressing the exterior of said container.

5. A method in accordance with claim 1, wherein said electronic component has a flat end surface and an opposite pair of major surfaces which are in series with said end surface through opposite edges of said end surface, and said electrode is formed to extend at least from one edge to another edge of said end surface.

6. A method in accordance with claim 5, wherein said electrode is formed to extend toward parts of said major surfaces in addition to said end surface.

7. A method in accordance with claim 1, wherein said electronic component has a rounded end surface, and said electrode is formed at least on said end surface.

8. A method in accordance with claim 1, wherein said step of bringing said electrode paste bath to a level reaching said surface to be provided with an electrode is carried out after said step of arranging said electronic component above said slit plate.

9. A method in accordance with claim 1, wherein said step of bringing said electrode paste bath to a level reaching said surface to be provided with an electrode is carried out in advance of said step of arranging said electronic component above said slit plate.

* * * * *